(12) United States Patent
Kakkad

(10) Patent No.: US 7,964,456 B2
(45) Date of Patent: *Jun. 21, 2011

(54) METHOD OF FABRICATING POLYSILICON THIN FILM AND THIN FILM TRANSISTOR USING POLYSILICON FABRICATED BY THE SAME METHOD

(75) Inventor: Ramesh Kakkad, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 644 days.

This patent is subject to a terminal disclaimer.

(21) Appl. No.: 11/033,493

(22) Filed: Jan. 12, 2005

(65) Prior Publication Data

US 2005/0186720 A1 Aug. 25, 2005

(30) Foreign Application Priority Data

Feb. 19, 2004 (KR) .................. 10-2004-0011146

(51) Int. Cl.
*H01L 21/20* (2006.01)
(52) U.S. Cl. ...................................... 438/166
(58) Field of Classification Search .................. 438/166, 438/486, 142, 487, 96, 488, 16, 97
See application file for complete search history.

(56) References Cited

U.S. PATENT DOCUMENTS

| 6,066,516 | A * | 5/2000 | Miyasaka | 438/149 |
|---|---|---|---|---|
| 6,881,618 | B2 * | 4/2005 | Yamamoto | 438/199 |
| 2002/0058366 | A1 * | 5/2002 | Miyasaki et al. | 438/166 |
| 2002/0102820 | A1 * | 8/2002 | Hamada et al. | 438/486 |

FOREIGN PATENT DOCUMENTS

| JP | 63-304670 | 12/1988 |
|---|---|---|
| JP | 08-330598 | 12/1996 |
| JP | 09-186085 | 7/1997 |
| JP | 11-329972 | 11/1999 |
| JP | 2001-185486 | 7/2001 |

OTHER PUBLICATIONS

Watakabe et al "Polycrysatlline Silicon Thin-Film Transistors Fabricated by Defect reduction Mehods" IEEE Transactions on Electronic Devices, vol. 49, No. 12Dec. 2002.*
"Polycrystalline Silicone Thin-film Transistor Fabricated by Defect Reduction Methods", to Watakabe, et al. IEEE Transaction on Electron Devices, vol. 49, No. 12, Dec. 2002.
Korean Office Action of the Korean Patent Application No. 2004-11146, issued on Feb. 22, 2006.
Office action from the Japanese Patent Office issued in Applicant's corresponding Japanese Patent Application No. 2004-340254 dated Mar. 24, 2009.

* cited by examiner

*Primary Examiner* — Savitri Mulpuri
(74) *Attorney, Agent, or Firm* — Robert E. Bushnell, Esq.

(57) ABSTRACT

A method of fabricating a polysilicon thin film produces a polysilicon thin film which is used to make a thin film transistor. The method includes depositing a silicon film containing amorphous silicon on a substrate, and performing thermal treatment on the silicon film at a predetermined temperature in an $H_2O$ atmosphere. Accordingly, the crystallization temperature and thermal treatment time are decreased when the amorphous silicon is crystallized by a solid phase crystallization method, and this prevents the substrate from being bent due to application of a thermal treatment process for a long time and at a high temperature. As a result of the invention, a polysilicon thin film having superior crystallization properties is obtained. Use of the polysilicon thin film in a thin film transistor results in the reduction of defects in the thin film resistor.

14 Claims, 1 Drawing Sheet

METHOD OF FABRICATING POLYSILICON THIN FILM AND THIN FILM TRANSISTOR USING POLYSILICON FABRICATED BY THE SAME METHOD

CLAIM OF PRIORITY

This application makes reference to, incorporates the same herein, and claims all benefits accruing under 35 U.S.C. §119 from an application entitled METHOD OF FABRICATING A POLYSILICON THIN FILM AND THIN FILM TRANSISTOR USING THE POLYSILICON THIN FILM FABRICATED BY THE SAME METHOD filed with the Korean Intellectual Property Office on Feb. 19, 2004, and there duly assigned Serial No. 2004-11146.

BACKGROUND OF THE INVENTION

1. Technical Field

The present invention relates to a method of fabricating a polysilicon thin film and to a thin film transistor using the polysilicon fabricated by the same method and, more particularly, to a method of fabricating a polysilicon thin film and to a thin film transistor using the polysilicon fabricated by the same method, whereby thermal treatment temperature and its time are reduced to prevent a substrate from bending and to cause the substrate to have less defects.

2. Related Art

An active organic electroluminescent display device includes a thin film transistor (TFT) used to apply current to a pixel region and a peripheral driving circuit region. The TFT commonly uses polysilicon. In general, the polysilicon is formed by crystallizing amorphous silicon.

Typical crystallization methods are mainly classified into a low-temperature crystallization method and a high-temperature crystallization method based on their crystallization temperature, that is, based on a temperature higher or lower than 500° C.

An excimer laser annealing (ELA) method using an excimer laser is commonly used as the low-temperature crystallization method, which may use a glass substrate because the method is performed at a crystallization temperature of about 450° C. However, the method causes fabrication cost to increase and causes the optimal size of the substrate to be limited, which leads to an increase in total cost for fabrication of the display device.

The high-temperature crystallization method includes a solid phase crystallization method, a rapid thermal annealing (RTA) method, and the like, which methods are widely used as a low-cost crystallization method.

However, the solid phase crystallization method requires the crystallization to be performed for 20 hours or more at a temperature of at least 600° C., and this can cause crystallization defects to occur in the crystallized polysilicon so that sufficient mobility cannot be obtained, and so that the substrate is easily deformed during the thermal treatment process. In addition, the glass substrate cannot be used because of the high-temperature crystallization. When the crystallization temperature is lowered, productivity is reduced.

In the meantime, the RTA method may allow the process to be performed in a relatively short time. However, the RTA methods that have been developed up to the present have disadvantages in that the substrate is easily deformed due to severe thermal shock and the electrical properties of the crystallized polysilicon are not good.

Accordingly, the method that must be used is a high-temperature thermal treatment method which has low cost when the crystallization is carried out in order to reduce the fabrication cost of the active device. However, there is also a need for the development of a high-temperature thermal treatment method having superior crystallization properties, which method uses a glass substrate with low cost and does not cause a problem such as bending of the substrate.

SUMMARY OF THE INVENTION

The present invention solves the aforementioned problems by providing a method of fabricating a polysilicon thin film, and a method of making a thin film transistor using the polysilicon fabricated by the same method. The method crystallizes polysilicon having superior crystallization properties and prevents the substrate from being bent due to high-temperature crystallization.

In an exemplary embodiment of the present invention, a method of fabricating a polysilicon thin film comprises: depositing a silicon film containing amorphous silicon on a substrate; and performing thermal treatment on the silicon film in an $H_2O$ atmosphere and at a predetermined temperature.

In another exemplary embodiment of the present invention, a thin film transistor uses the polysilicon thin film fabricated by the above-mentioned method.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
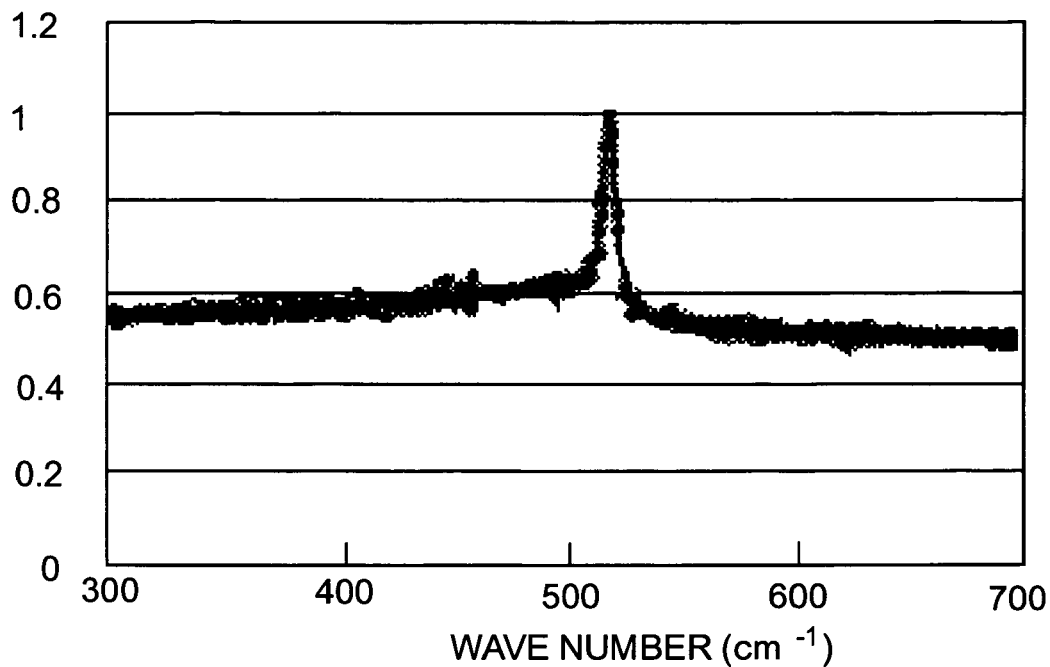
FIG. 1 is a graph showing a Raman spectrum of polysilicon fabricated by embodiments of the present invention.

Exemplary embodiments of the present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

In accordance with the invention, amorphous silicon or a silicon film containing a large amount of the amorphous silicon is deposited on a substrate. In this case, a transparent and insulating glass substrate is typically used as the substrate.

Methods for depositing the silicon film typically include a plasma enhanced chemical vapor deposition (PECVD) method, a low pressure chemical vapor deposition (LPCVD) method, and the like.

Thermal treatment is then performed on the amorphous silicon or the silicon film containing a large amount of the amorphous silicon. In this case, the amorphous silicon is subjected to solid phase crystallization so as to be polysilicon when heat is applied to the silicon film.

A rapid thermal annealing (RTA) process, which is a typical high-temperature thermal treatment process, is used for the thermal treatment process in the method of the present invention, and the thermal treatment is carried out in an H₂O atmosphere other than a conventional atmosphere of N₂, O₂, inert gas such as Ar, or a combination thereof.

When the thermal treatment is carried out in an H₂O atmosphere, the thermal treatment time decreases at the same temperature and the thermal treatment temperature also decreases at the same time compared to that in a conventional atmosphere of N₂, O₂, inert gas such as Ar, or a combination thereof.

In particular, the substrate is bent at a high temperature when a transparent insulating substrate, such as glass, is used as the substrate. However, in accordance with the present invention, the substrate may be prevented from being bent when the thermal treatment temperature decreases.

The thermal treatment temperature preferably ranges from 550° C. to 750° C. in accordance with the present invention, and more preferably ranges from 600° C. to 710° C. When the temperature is less than 550° C., a long time is required for crystallization, and when the temperature exceeds 750° C., the substrate may be bent so that it is not preferable. Accordingly, superior polysilicon may be preferably obtained with an appropriate thermal treatment time in a temperature range of 600° C. to 700° C.

The pressure of the H₂O is proportional to the crystallization speed such that the crystallization speed increases as the pressure becomes higher. It is not preferable that the crystallization speed become low so as to cause the thermal treatment time to be lengthened when the pressure is too low, as this may adversely affect the substrate. Accordingly, it is preferable to set the pressure of H₂O as high as possible. However, the pressure should not be too high because it may cause an explosion. Thus, the pressure preferably ranges from 10,000 Pa to 2 MPa.

In the meantime, the silicon film may be deposited to a thickness of 2,000 Å or less, and crystallization may be facilitated when the thickness becomes small. However, it may adversely affect the properties of a thin film transistor when polysilicon which is too thin is used for the thin film transistor. Therefore, the silicon film is preferably deposited to a thickness of about 1,000 Å to 1,000 Å.

The polysilicon may be formed by performing the above-mentioned processes. However, the thermal treatment process may be performed once more in order to reduce defects of the polysilicon formed in accordance with the present invention.

The thermal treatment process may be performed by an excimer laser annealing method or by applying heat in a furnace.

When the amorphous silicon is crystallized in the above-mentioned H₂O atmosphere, a full width at half maximum (FWHM) of the polysilicon thin film ranges from about 6.5 cm⁻¹ to about 7.5 cm⁻¹, and polysilicon is obtained in which the FWHM of the polysilicon thin film ranges from about 6.5 cm⁻¹ to about 7.5 cm⁻¹. The FWHM of the polysilicon fabricated by the thermal treatment process in an inert atmosphere is typically 7.5 cm⁻¹ or more.

Hereinafter, the present invention will be described more fully, preferred embodiments of the invention being shown. This invention may, however, be embodied in different forms and the invention should not be construed as limited to the embodiments set forth herein.

First to Third Examples

An amorphous silicon film was deposited to a thickness of 500 Å on a substrate. A low pressure chemical vapor deposition (LPCVD) method was used for the first example, a plasma enhanced chemical vapor deposition (PECVD) method utilizing hydrogen of 2% or less was used for the second example, and a PECVD utilizing hydrogen of 10% or more was used for the third example. The amorphous silicon film was then thermally treated so as to be crystallized by means of RTA for 10 minutes or less at a temperature of about 700° C. Carrier gas such as O₂ or N₂ and H₂O atmospheres were used for the thermal treatment. A Raman spectrum of the formed polysilicon is shown in FIG. 1.

First Comparative Example

Figure 2:
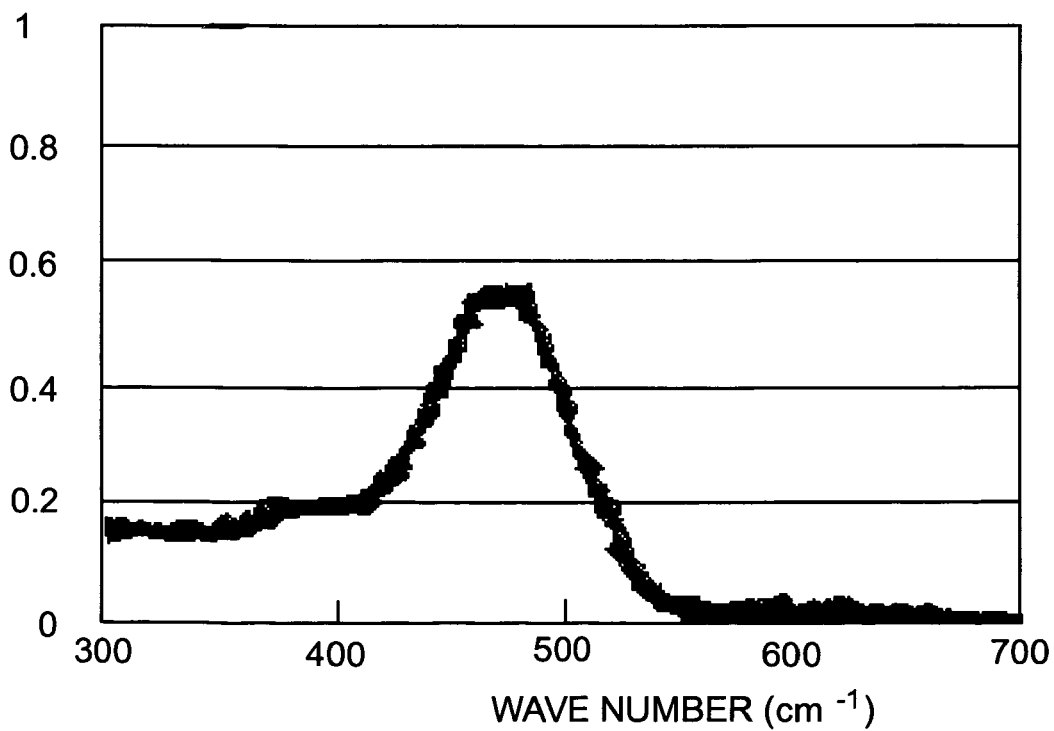
FIG. 2 is a graph showing a Raman spectrum of polysilicon fabricated by other methods.

The same process used for as the first to third examples was performed in the first comparative example except that an N₂ atmosphere was used for the thermal treatment. That is, the thermal treatment temperature was 700° C., and its result is shown in FIG. 2.

In this case, in order to completely crystallize the amorphous silicon, the thermal treatment temperature should have been 750° C. with the same thermal treatment time as in the first to third examples.

Referring to FIG. 1, it can be seen that a peak close to 520 cm⁻¹ represents the presence of the crystalline silicon in a Raman spectrum of polysilicon obtained by performing thermal treatment on the amorphous silicon at 700° C. and in an H₂O atmosphere. However, when the crystallization is performed without using H₂O, it can be seen that the peak close to 520 cm⁻¹ is not present but a wide peak around 480 cm⁻¹ is present as shown in FIG. 2. The wide peak of 480 cm⁻¹ indicates the presence of amorphous silicon, that is, it can be seen that the crystallization was partially performed.

Accordingly, it is obvious that use of the H₂O atmosphere for the thermal treatment contributes to the crystallization of the amorphous silicon. In addition, as can be seen from FIG. 1, the FWHM of the Raman peak of the polysilicon crystallized by the first to third examples is 6.8 cm⁻¹, which means that the polysilicon has superior crystallization properties. The FWHM of the polysilicon fabricated by the thermal treatment process in an inert atmosphere is typically 7.5 cm⁻¹ or more.

Fourth Example

Amorphous silicon was deposited on a substrate to a thickness of about 1,000 Å by a PECVD method. The amorphous silicon was heated at 600° C. and at an H₂O vapor pressure of 2 MPa. The crystallization speed of the silicon is low at 600° C. However, since the crystallization speed is proportional to the pressure, the oxidation speed could have been adjusted by increasing the pressure. That is, increasing the pressure could reduce the crystallization temperature and its time. The crystallization time was measured to be 2 hours or less at this moment.

Second Comparative Example

The same process as in the fourth example was performed in the second comparative example except that an N₂ atmosphere of 1 MPa was used in crystallizing the amorphous silicon. In this case, the crystallization time was measured to be about 5 hours, which resulted from the fact that the amorphous silicon had contained nucleating sites through thermal treatment in advance. On the other hand, amorphous silicon that has not been subject to any thermal treatment requires 20 hours or more to be crystallized.

When the fourth example is compared to the second comparative example, it can be seen from the fourth example that the thermal treatment time in $H_2O$ atmosphere is reduced almost 2.5 times that in $N_2$ atmosphere. In addition, increasing the pressure of $H_2O$ may reduce the thermal treatment temperature and its required treatment time. Since the thermal treatment temperature and treatment time are reduced, it is possible to reduce the fabrication cost and to prevent the substrate from being bent due to application of heat to the substrate.

The amorphous silicon and $H_2O$ react during the thermal treatment process so as to oxidize Si, thereby forming a thin $SiO_2$ layer on a surface of Si. Remaining Si (that is, Si which does not react with the $H_2O$) is present within the $SiO_2$ layer formed by the oxidation, which becomes interstitial Si. A concentration of the interstitial Si affects the diffusion factor of the silicon, which in turn affects the crystallization process. A similar procedure may be followed, even when the thermal treatment is performed in $O_2$ atmosphere. However, the crystallization speed is faster in an $H_2O$ atmosphere than in an $O_2$ atmosphere so that the temperature and time are reduced.

As a result, when the concentration of the interstitial Si increases, the crystallization speed of the amorphous silicon also increases, so that the required crystallization temperature or the required crystallization time may be decreased or shortened compared to the conventional thermal treatment atmosphere using only $N_2$ or $O_2$ gas.

The polysilicon thin film fabricated by the above-mentioned processes may be applied to the thin film transistor, and such thin film transistor may be applied to a flat panel display device, such as an organic electroluminescent display device or a liquid crystal display device.

As mentioned above, $H_2O$ is used for the thermal treatment atmosphere when the amorphous silicon is crystallized by the solid phase crystallization method in accordance with the present invention, so that the thermal treatment time and temperature may be reduced, thereby preventing defects such as bending of the substrate during its process.

Although the present invention has been described with reference to certain exemplary embodiments thereof, it will be understood by those skilled in the art that a variety of modifications and variations may be made to the present invention without departing from the spirit or scope of the present invention as defined in the appended claims, and their equivalents.

What is claimed is:

1. A method of fabricating a polysilicon thin film, comprising:
    depositing a silicon film containing amorphous silicon on a substrate; and
    crystallizing the silicon film via solid phase crystallization by performing thermal treatment on the silicon film in an atmosphere that includes $H_2O$ at a predetermined temperature;
    wherein a pressure of the $H_2O$ is at least 10,000 Pa and the thermal treatment has a duration of 10 minutes or less.

2. The method of claim 1, wherein the predetermined temperature is in a range of 550° C. to 750° C.

3. The method of claim 2, wherein the predetermined temperature is in a range of 600° C. to 700° C.

4. The method of claim 1, wherein the partial pressure of the $H_2O$ is in a range of 10,000 Pa to 2 MPa.

5. The method of claim 1, wherein a thickness of the silicon film is no greater than 2000 Å.

6. The method of claim 5, wherein the thickness of the silicon film is in a range of 300 Å to 1,000 Å.

7. A method of fabricating a polysilicon thin film, comprising:
    depositing a silicon film containing amorphous silicon on a substrate; and
    crystallizing the silicon film by solid phase crystallization by performing thermal treatment on the silicon film in an atmosphere that includes $H_2O$ at a predetermined temperature, a pressure of the $H_2O$ in said atmosphere being at least 100,000 Pa, the thermal treatment having a duration of 10 minutes or less.

8. A method of fabricating a polysilicon thin film, comprising:
    depositing a silicon film containing amorphous silicon on a substrate; and
    producing said polysilicon thin film by solid phase crystallization by performing a thermal treatment on the silicon film in an atmosphere that includes $H_2O$ at a predetermined temperature, a pressure of the $H_2O$ in said atmosphere being at least 10,000 Pa, said method being absent a melting of the silicon film, the thermal treatment having a duration of 10 minutes or less.

9. The method of claim 1, wherein the silicon film is deposited by any one of a low pressure chemical vapor deposition (LPCVD) method and a plasma enhanced chemical vapor deposition (PECVD) method.

10. A method of fabricating a polysilicon thin film, comprising:
    depositing a silicon film containing amorphous silicon on a substrate; and
    crystallizing the silicon film via solid phase crystallization by performing a thermal treatment on the silicon film in an $H_2O$ atmosphere at a predetermined temperature, the thermal treatment on the silicon film is performed in the $H_2O$ atmosphere at a pressure of at least 10,000 Pa, the thermal treatment having a duration of 10 minutes or less.

11. The method of claim 8, wherein the pressure of the $H_2O$ in said atmosphere is in a range of 100,000 Pa to 2 MPa.

12. The method of claim 10, further comprising performing thermal treatment on the silicon film by an excimer laser annealing (ELA) method once more after performing the thermal treatment on the silicon film in the $H_2O$ atmosphere at the predetermined temperature.

13. The method of claim 1, wherein the pressure of the $H_2O$ is in a range of 100,000 Pa to 2 Mpa.

14. The method of claim 10, wherein the thermal treatment on the silicon film is performed in the $H_2O$ atmosphere at a pressure of at least 100,000 Pa.

* * * * *